(12) United States Patent
Bang et al.

(10) Patent No.: US 6,861,682 B2
(45) Date of Patent: Mar. 1, 2005

(54) LASER LINK STRUCTURE CAPABLE OF PREVENTING AN UPPER CRACK AND BROADENING AN ENERGY WINDOW OF A LASER BEAM, AND FUSE BOX USING THE SAME

(75) Inventors: Jeong-ho Bang, Yongin (KR); Kyeong-seon Shin, Euiwang (KR); Sang-seok Kang, Suwon (KR); Ho-jeong Choi, Suwon (KR); Hyen-wook Ju, Suwon (KR); Kwang-kyu Bang, Suwon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 175 days.

(21) Appl. No.: 10/290,269

(22) Filed: Nov. 8, 2002

(65) Prior Publication Data

US 2003/0095451 A1 May 22, 2003

(30) Foreign Application Priority Data

Nov. 22, 2001 (KR) ......................................... 2001-72985

(51) Int. Cl.$^7$ ............................................... H01L 27/10
(52) U.S. Cl. .................... 257/209; 257/50; 257/211; 257/529; 257/530
(58) Field of Search .......................... 257/50, 209, 211, 257/529, 530

(56) References Cited

U.S. PATENT DOCUMENTS 5,940,727 A * 8/1999 Bernstein .................... 438/600

* cited by examiner

Primary Examiner—Richard Elms
Assistant Examiner—Douglas Menz
(74) Attorney, Agent, or Firm—Lee, Sterba, & Morse, P.C.

(57) ABSTRACT

A laser link structure used in semiconductor devices and a fuse box using the laser link structure preferably include a plurality of first conductive line patterns positioned in parallel at predetermined intervals, and a second conductive line pattern broadly formed on the plurality of first conductive line patterns for forming hole regions which link the second conductive line pattern to the plurality of first conductive line patterns. Preferably, at least one hole region is formed on each of the plurality of first conductive line patterns, and via holes are formed in the hole regions.

14 Claims, 5 Drawing Sheets

LASER LINK STRUCTURE CAPABLE OF PREVENTING AN UPPER CRACK AND BROADENING AN ENERGY WINDOW OF A LASER BEAM, AND FUSE BOX USING THE SAME

BACKGROUND OF THE INVENTION

1. Field of the Invention

The present invention relates to a semiconductor device. More particularly, the present invention relates to a laser link structure used in semiconductor devices and a fuse box using the laser link structure.

2. Description of the Related Art

In general, in order to increase yield, a semiconductor device includes normal memory cell arrays and redundancy memory cell arrays, in which a normal memory cell having defects (hereinafter, 'defective cell') is replaced with a redundancy memory cell (hereinafter, 'redundant cell').

As is well known in the art, a semiconductor memory device includes a redundancy circuit for replacing a defective cell with a redundant cell. The redundancy circuit includes program means for programming the address of a defective cell and a predetermined control circuit for controlling the redundancy circuit. The program means includes a plurality of fuses that decode the address of a defective cell using laser or an electric current so as to replace the defective cell with a redundant cell. The program means is generally called a 'fuse box.'

In general, fuses are formed of polysilicon fuses or make-links. Make-links are also called 'laser links.' However, in the event that fuses are formed of polysilicon, the layout area of a fuse box is increased. For this reason, recently, fuses formed of make-links are preferred.

FIG. 1 illustrates a view of a layout of a conventional laser link structure. FIG. 2 illustrates a cross-sectional view of the conventional laser link structure of FIG. 1, taken along section line X–X'.

Referring to FIGS. 1 and 2, a first plasma-enhanced TEOS (PTEOS) layer 23, a first nitride layer (SiN) 25, a first conductive line pattern 11, a second PTEOS layer 27, and a second nitride layer (SiN) 29 are sequentially formed on a silicon wafer 21. Second conductive line patterns 13 are formed on the first conductive line pattern 11. A laser beam is scanned over a hole region 15 so as to link the first conductive line pattern 11 with the second conductive line patterns 13.

More specifically, if a laser beam is scanned over the hole region 15 for a predetermined time, the laser beam is focused on the first conductive line pattern 11, causing thermal energy to penetrate the first conductive line pattern 11. As a result, the first conductive line pattern 11 expands, and lower cracks form therein, thus resulting in the first conductive line pattern 11 being linked with the second conductive line patterns 13.

Disadvantageously, upon application of a laser beam of a relatively high energy to hole region 15, either the sides of the second conductive line pattern 13 may break or cracks may form in the second conductive line pattern 13. In this case, the first conductive line pattern 11 would not be properly linked with the second conductive line pattern 13.

Additionally, there is a limit in reducing the area of the fuse box since the energy window of a laser beam is narrow. In other words, if a distance between a first conductive line pattern 11 and another first conductive line pattern 11, i.e., a fuse pitch, is reduced, the size of the hole region 15 is also reduced. This leads to a reduction in the energy window of the laser beam when the high-energy laser beam is scanned over the hole region 15.

SUMMARY OF THE INVENTION

In an effort to solve the above-described problems, it is a first feature of an embodiment of the present invention to provide a laser link structure having a crack-free second conductive line pattern and having a reduced-size fuse box and a broadened energy window of a laser beam.

It is a second feature of an embodiment of the present invention to provide a fuse box using such a laser link structure.

A laser link structure of a semiconductor device according to a preferred embodiment of the present invention preferably includes a plurality of first conductive line patterns positioned in parallel at predetermined intervals and a second conductive line pattern broadly formed on the plurality of first conductive line patterns for forming hole regions which link the second conductive line pattern to the plurality of first conductive line patterns. An insulating layer is preferably formed between the plurality of first conductive line patterns and the second conductive line pattern. Preferably, at least one hole region is formed on each of the plurality of first conductive line patterns, and a via hole is formed in each hole region.

A fuse box of a semiconductor device according to a preferred embodiment of the present invention preferably includes a plurality of laser links for decoding a predetermined address, wherein each one of the plurality of laser links includes a plurality of first conductive line patterns positioned in parallel at predetermined intervals and a second conductive line pattern broadly formed on the plurality of first conductive line patterns for forming hole regions which link the second conductive line pattern to the plurality of first conductive line patterns. An insulating layer is preferably formed between the plurality of first conductive line patterns and the second conductive line pattern. Preferably, at least one hole region is formed on each of the plurality of first conductive line patterns, and a via hole is formed in each hole region.

BRIEF DESCRIPTION OF THE DRAWINGS

The above features and advantages of the present invention will become more apparent to those of ordinary skill in the art by describing in detail a preferred embodiment thereof with reference to the attached drawings in which.

DETAILED DESCRIPTION OF THE INVENTION

Korean Patent Application No. 2001-72985, filed Nov. 22, 2001, and entitled: "Laser Link Structure Capable of Protecting Upper Crack and Broadening Energy Window of Laser Beam, and Fuse Box Using the Same," is incorporated by reference herein in its entirety.

Figure 1:
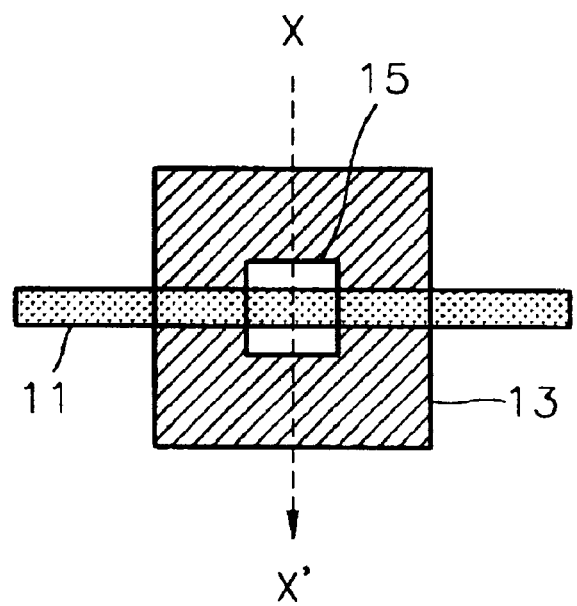
FIG. 1 illustrates a view of the layout of a conventional laser link structure.
Figure 2:
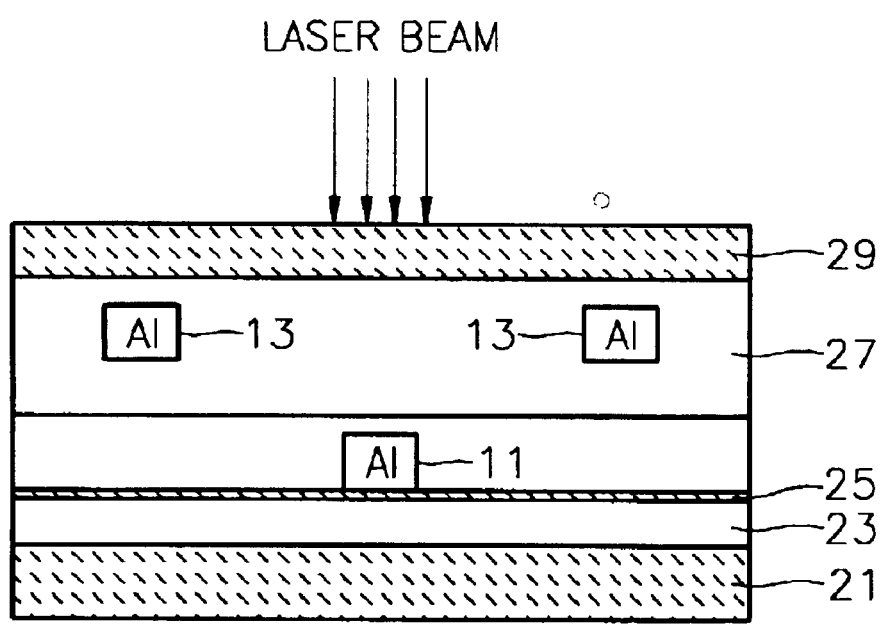
FIG. 2 illustrates a cross-sectional view of the conventional laser link structure of FIG. 1, taken along section line X–X'.
Figure 3:
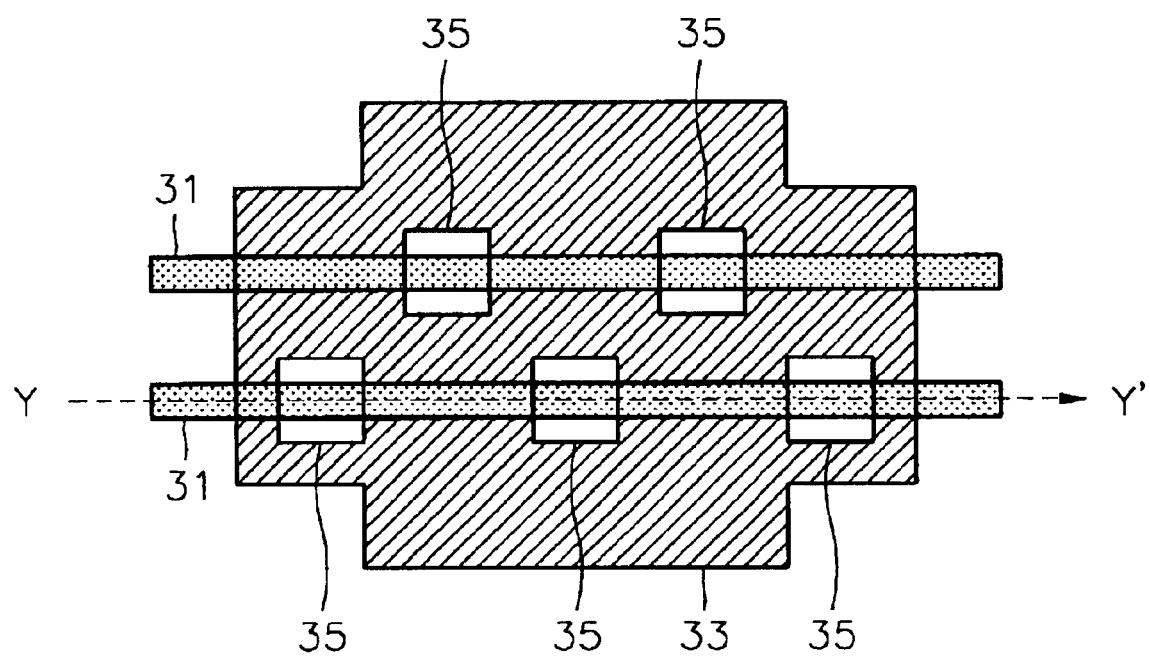
FIG. 3 illustrates a view of the layout of a laser link structure according to an embodiment of the present invention.

FIG. 3 illustrates a view of a preferred layout of a laser link structure according to the present invention. The laser link structure shown in FIG. 3 differs from the conventional laser link structure of FIG. 1 in that a second conductive line pattern 33 is preferably broadly formed on two or more first conductive line patterns 31 which are positioned in parallel at predetermined intervals. Further, at least one hole region 35 is preferably formed on each of the first conductive line patterns 31.

Figure 4:
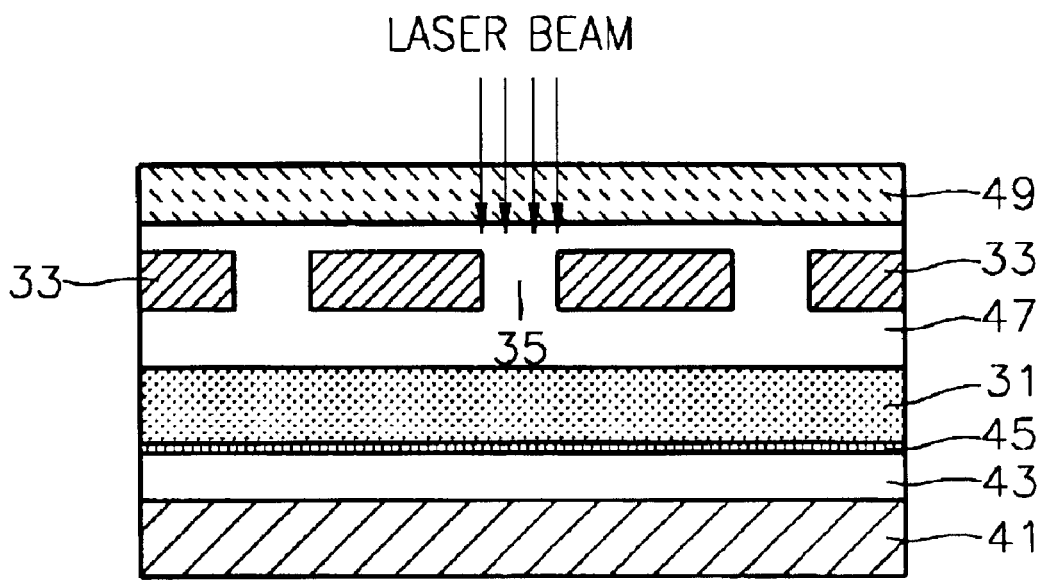
FIG. 4 illustrates a cross-sectional view of the laser link structure of FIG. 3, taken along section line Y–Y'.
Figure 5:
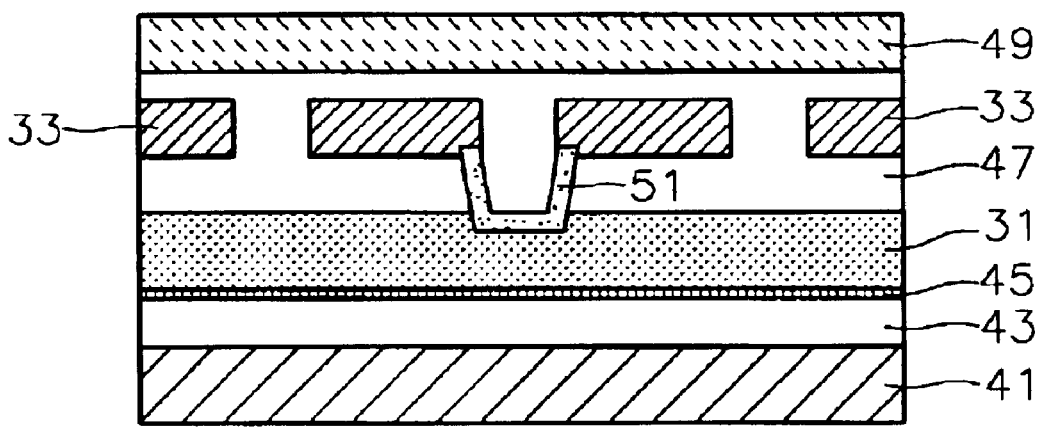
FIG. 5 illustrates a view of the laser link structure of FIG. 3 in which a first conductive line pattern and a second conductive line pattern are linked with each other by lower cracks.

FIG. 4 illustrates a cross-sectional view of the laser link structure of FIG. 4, taken along section line Y–Y'. FIG. 5 illustrates a view of the laser link structure of FIG. 3 in which the first conductive line patterns 31 are linked with the second conductive line pattern 33.

Referring to FIG. 4, a first PTEOS layer 43, which is an insulating layer, a first nitride (SiN) layer 45, the first conductive line patterns 31, and a second PTEOS layer 47 are sequentially formed on a silicon wafer 41. Then, the second conductive line pattern 33 is formed on the first conductive line patterns 31, and a second SiN layer 49 is formed to cover the second conductive line pattern 33.

When a laser beam is scanned over one of the hole regions 35 so as to link the first conductive line pattern 31 with the second conductive line pattern 33 for a predetermined time, the laser beam becomes focused on the first conductive line patterns 31 causing thermal energy to penetrate the first conductive line patterns 31. As a result, as shown in FIG. 5, the first conductive line patterns 31 expand, and a crack 51 forms therein, thereby linking the first conductive line patterns 31 with the second conductive line pattern 33.

Preferably, to make a strong link between the first conductive line patterns 31 and the second conductive line pattern 33, via holes are formed in the hole regions 35 through which a laser beam can be focused on the first conductive line patterns 31.

In a laser link structure of the present invention, the energy of the laser beam becomes dispersed by the second conductive line pattern 33 due to the second conductive line pattern 33 being broadly formed. Therefore, the occurrence of upper cracks in the second conductive line pattern 33 are prevented, and thus the first conductive line patterns 31 become very strongly linked to the second conductive lie pattern 33. Accordingly, scanning a high-energy laser beam over the hole regions 35 broadens the energy window of the laser beam. Since, the second conductive line pattern 33 is shared by several first conductive line patterns 31, the distance between adjacent first conductive line patterns 31 may be reduced along with the size of the hole regions 35 and thus the size of the fuse box.

In addition, in a laser link structure according to the present invention, a plurality of hole regions 35 may be formed on each of the first conductive line patterns 31, which means that in the event that laser linking is not properly performed in one of the hole regions 35, laser linking may still be performed in the other hole regions 35. Thus, it is possible to successfully link the first conductive line patterns 31 with the second conductive line pattern 33.

Figure 6:
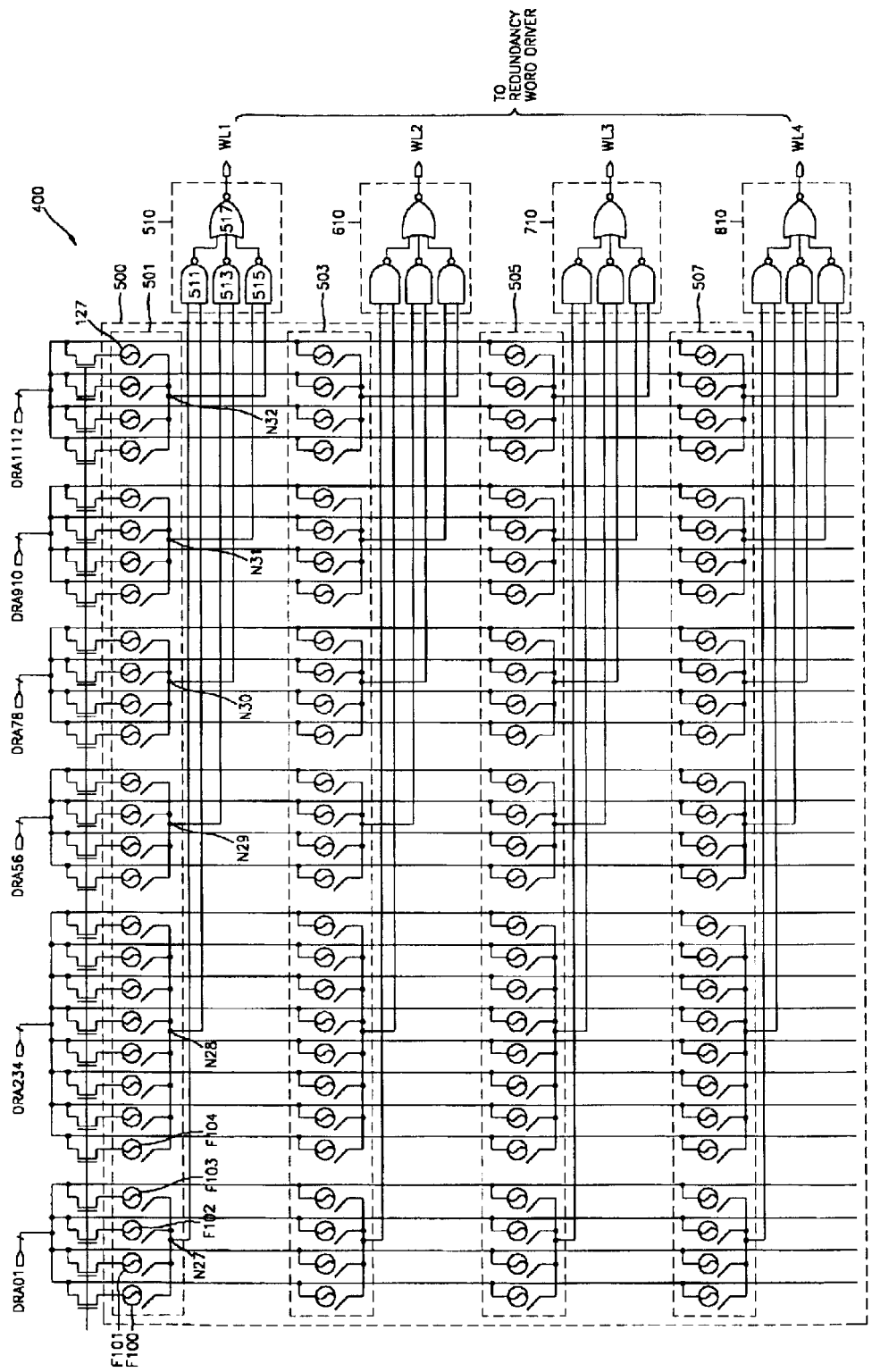
FIG. 6 illustrates a circuit diagram of an exemplary redundant row address decoder including a fuse box that uses laser linking according to the present invention.

FIG. 6 illustrates a circuit diagram of an exemplary redundant row address decoder 400 including a fuse box that uses laser linking. The redundant row address decoder 400 preferably has a structure capable of replacing one defective cell with one redundant cell. Referring to FIG. 6, the redundant row address decoder 400 includes a plurality of transistors, a fuse box 500, and redundancy word line selection circuits 510, 610, 710 and 810.

The fuse box 500 further includes first through fourth fuse boxes 501, 503, 505 and 507, each of which includes a plurality of laser links. The laser links are selectively linked and used for decoding the address of a defective cell. Here, address DRA01 is an address for selecting one word line. The fuse boxes 501, 503, 505, and 507 are decoded by a generally understood method, and thus their explanation will be omitted for brevity.

Hereinafter, a case where an exemplary word line WL1 is selected will now be described with reference to FIG. 6. Laser links F100 through F103 are decoded so as to indicate the address DRA01 of a defective cell, and other laser links F104 through F127 are decoded to correspond to the addresses DRA234, DRA56, DAR78, DRA910, and DRA1112 of the defective cell.

The redundancy word line selection circuit 510 includes a first NAND gate 511, a second NAND gate 513, a third NAND gate 515, and an NOR gate 517. In response to signals output from nodes N27 through N32, the redundancy word line selection circuit 510 outputs a redundancy word line enable signal WL1 to a redundancy word driver (not shown). Then, the redundancy word driver replaces the defective cell with the redundant cell by enabling the word line of a redundant cell.

Figure 7:
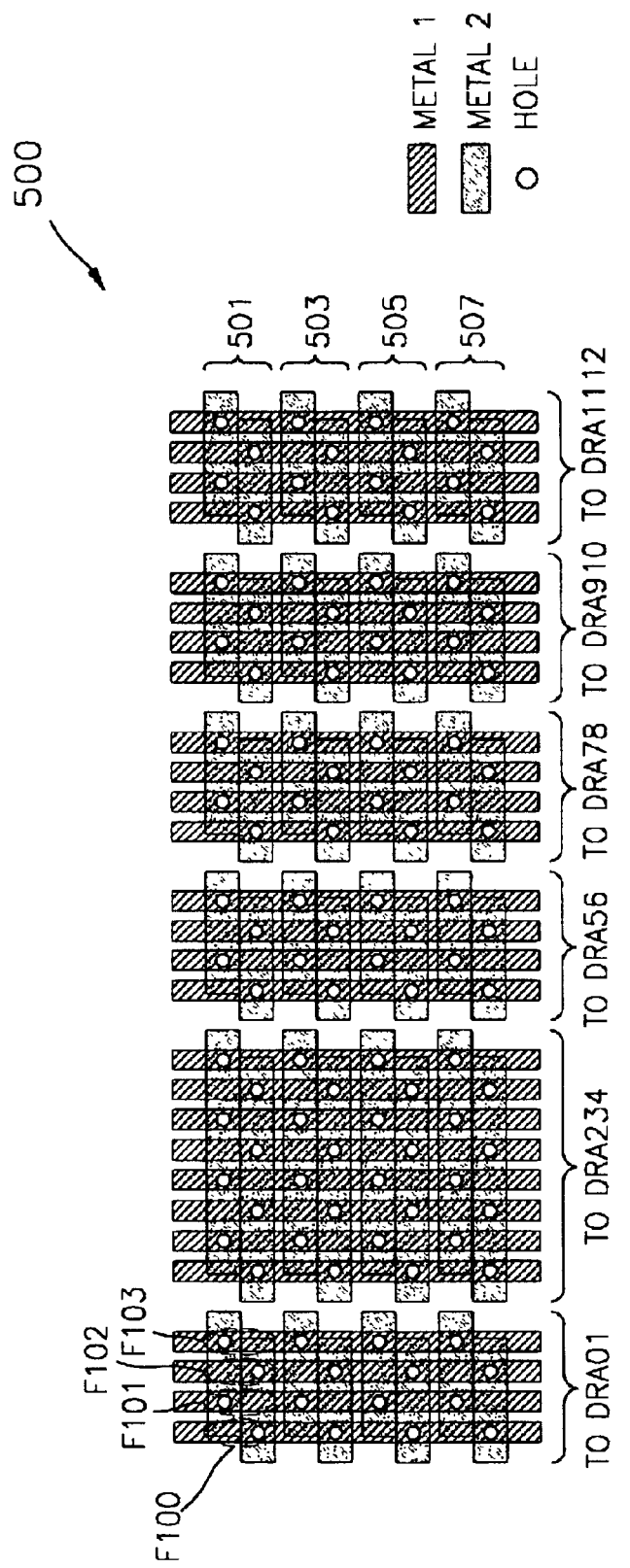
FIG. 7 illustrates a view of the layout of the fuse box of FIG. 6.

FIG. 7 illustrates a view of the layout of the fuse box 500 of FIG. 6. The fuse box 500 includes the first through fourth fuse boxes 501, 503, 505, and 507, which are used to replace one defective cell with one redundant cell. Scanning a laser beam into a hole region (not shown) causes first conductive line patterns METAL1 be linked to second conductive line pattern METAL2. As shown in FIG. 7, the second conductive line pattern METAL2 is preferably shared by several first conductive line patterns METAL1, thereby reducing a fuse pitch, i.e., the distance between adjacent first conductive line patterns METAL1. As a result, the size of the hole region may be reduced accordingly. Thus, the size of a fuse box of FIG. 7 using the laser link structure of the present invention may also be reduced accordingly. Further, the layout area of a redundant row address decoder having such a fuse box may be significantly reduced.

As described above, in a laser link structure according to the present invention, upper cracks do not occur in a second conductive line pattern, and as a result, first conductive line patterns may be very strongly linked with the second conductive line pattern, as compared to conventional implementations. In addition, the energy window of the laser beam is broadened. Further, a single second conductive line pattern is preferably shared by several first conductive line patterns, thereby reducing a fuse pitch and the size of the hole region and the size of the fuse box. Also, in a laser link structure according to the present invention, a plurality of hole regions may be formed on each of the first conductive line patterns. Therefore, in the event that the laser linking operation is not satisfactorily performed using one of the hole regions, it may be performed using another of the hole regions, thereby increasing the ratio of laser linking.

While the present invention has been particularly shown and described with reference to a preferred embodiment thereof, it will be understood by those skilled in the art that various changes in form and details may be made therein without departing from the spirit and scope of the present invention as defined by the following claims.

What is claimed is:

1. A laser link structure of a semiconductor device, comprising:
   a plurality of first conductive line patterns positioned in parallel at predetermined intervals; and
   a second conductive line pattern formed on the plurality of first conductive line patterns, the second conductive line pattern extending over at least two of the plurality of first conductive lines patterns and including hole regions which allow the second conductive line pattern to be linked to the plurality of first conductive line patterns at the hole regions.

2. The laser link structure as claimed in claim 1, wherein at least one hole region is formed on each of the plurality of first conductive line patterns.

3. The laser link structure as claimed in claim 1, wherein an insulating layer is formed between the plurality of first conductive line patterns and the second conductive line pattern.

4. The laser link structure as claimed in claim 1, wherein a via hole is formed in each hole region.

5. The laser link structure as claimed in claim 2, wherein a hole region in one of the plurality of first conductive line patterns is shifted relative to a hole region in an adjacent first conductive line pattern.

6. The laser link structure as claimed in claim 2, wherein at least two hole regions are formed on each of the plurality of first conductive line patterns.

7. The laser link structure as claimed in claim 1, wherein, other than at the hole regions, the second conductive line pattern is continuous across the plurality of first conductive line patterns.

8. A fuse box of a semiconductor device, comprising:
   a plurality of laser links for decoding a predetermined address, wherein each one of the plurality of laser links includes:
      a plurality of first conductive line patterns positioned in parallel at predetermined intervals; and
      a second conductive line pattern formed on the plurality of first conductive line patterns, the second conductive line pattern extending over at least two of the plurality of first conductive lines patterns and including hole regions which allow the second conductive line pattern to be linked to the plurality of first conductive line patterns at the hole regions.

9. The fuse box as claimed in claim 8, wherein at least one hole region is formed on each of the plurality of first conductive line patterns.

10. The fuse box as claimed in claim 8, wherein an insulating layer is formed between the plurality of first conductive line patterns and the second conductive line pattern.

11. The fuse box as claimed in claim 8, wherein a via hole is formed in each hole region.

12. The fuse box as claimed in claim 9, wherein a hole region in one of the plurality of first conductive line patterns is shifted relative to a hole region in an adjacent first conductive line pattern.

13. The fuse box as claimed in claim 9, wherein at least two hole regions are formed on each of the plurality of first conductive line patterns.

14. The fuse box as claimed in claim 8, wherein, other than at the hole regions, the second conductive line pattern is continuous across the plurality of first conductive line patterns.

* * * * *